US012666920B2

(12) United States Patent
Li et al.

(10) Patent No.: US 12,666,920 B2
(45) Date of Patent: Jun. 23, 2026

(54) CHUCKING SENSOR USING FLOATING ESC POWER SUPPLIES

(71) Applicant: Applied Materials, Inc., Santa Clara, CA (US)

(72) Inventors: Jian Li, Fremont, CA (US); Bryan Liao, Sunnyvale, CA (US); Juan Carlos Rocha-Alvarez, San Carlos, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 72 days.

(21) Appl. No.: 18/617,274

(22) Filed: Mar. 26, 2024

(65) Prior Publication Data

US 2025/0308967 A1     Oct. 2, 2025

(51) Int. Cl.
H01T 23/00          (2006.01)
H10P 14/60          (2026.01)
(Continued)

(52) U.S. Cl.
CPC ........ H10P 72/722 (2026.01); H10P 14/6336 (2026.01); H10P 72/0602 (2026.01)

(58) Field of Classification Search
None
See application file for complete search history.

(56) References Cited

U.S. PATENT DOCUMENTS 7,955,646 B2 * 6/2011 Cruse ................ H01L 21/28525
427/255.12

2006/0256499 A1 * 11/2006 Yang ................. H01J 37/32935
361/234
(Continued)

FOREIGN PATENT DOCUMENTS

| KR | 20230075491 A | 5/2023 |
| TW | 202226368 A | 7/2022 |
| WO | 2008043047 A2 | 4/2008 |

OTHER PUBLICATIONS

International Patent Application No. PCT/US2025/021123, "International Search Report and Written Opinion", Jul. 15, 2025, 10 pages.
Taiwanese Patent Application No. 114111181, "Office Action", Jan. 27, 2026, 10 pages.

*Primary Examiner* — Stephen W Jackson
(74) *Attorney, Agent, or Firm* — Kilpatrick Townsend & Stockton LLP

(57)          ABSTRACT

Electrostatic chucks (ESCs) are used to provide a clamping force between the substrate and the pedestal during semiconductor processes. However, it is difficult to measure a chucking state of the substrate during a live process, as this usually requires invasive measurements or additional hardware to be added to the pedestal. A new technique for monitoring a chucking state electrically isolates the ESC from the system ground to create a single conductive path through the ESC power supplies, ESC electrodes, and the substrate. A floating voltage between the two power supplies may change with the chucking state of the substrate, and this voltage may be monitored to determine the real-time chucking state of the substrate. This provides an unintrusive way to monitor the ESC state in real-time during a semiconductor process at the controller without disturbing the process or modifying the pedestal.

16 Claims, 7 Drawing Sheets

(51) Int. Cl.
   *H10P 72/00*          (2026.01)
   *H10P 72/72*          (2026.01)

(56)                    References Cited

U.S. PATENT DOCUMENTS

2010/0061033 A1 *   3/2010   Regan ................. H01L 21/6831
                                                      361/234
2010/0243606 A1 *   9/2010   Koshimizu ....... H01J 37/32091
                                                      156/345.44
2015/0132967 A1     5/2015   Urakawa et al.
2019/0080949 A1 *   3/2019   Boyd, Jr. ............ C23C 16/4585
2023/0130919 A1     4/2023   Match et al.
2023/0207372 A1     6/2023   Li et al.

* cited by examiner

500

502

Apply a chucking voltage to an electrode of an ESC in a pedestal from a first output of a power source

504

Measure a voltage at a second output of the power source for the ESC

506

Determine the chucking state of the substrate based at least in part on the voltage at the second output of the power source

CHUCKING SENSOR USING FLOATING ESC POWER SUPPLIES

TECHNICAL FIELD

This disclosure generally describes methods and systems for powering an electrostatic chuck in a semiconductor processing system. More specifically, this disclosure describes a chucking sensor using floating power supplies for an electrostatic chuck.

BACKGROUND

Semiconductor processing systems enable the precise manufacturing of electronic devices with intricate functionalities. These systems involve complex procedures such as etching, deposition, and lithography, for creating devices with specific characteristics. Electrostatic chucks (ESCs) play a crucial role in semiconductor processing chambers, where precision and control are paramount. These innovative devices are designed to securely hold delicate semiconductor wafers in place during various stages of the manufacturing process. Unlike traditional mechanical clamps, ESCs utilize the principles of electrostatic attraction to immobilize the wafer without any physical contact. This contactless grip minimizes the risk of damage to the wafer's surface, ensuring the integrity of the semiconductor material. By generating an electrostatic field between the chuck and the wafer, ESCs create a hold that prevents wafer movement and maintains a flat wafer profile. This precision is crucial in semiconductor manufacturing, where even minor misalignments can lead to defects and reduced yield. Thus, there is a need for improved systems and methods related to chucking systems and sensors. These and other needs are addressed by the present technology.

SUMMARY

In some embodiments, a semiconductor processing chamber may include a pedestal configured to support a substrate during a semiconductor process. The pedestal may include a first electrode and a second electrode for an ESC. The semiconductor processing chamber may also include a chamber body that may enclose the pedestal to form a processing region in which the semiconductor process is performed. The chamber body may be electrically connected to a system ground. The semiconductor processing chamber may additionally include a first power source for the ESC that may be electrically connected to the first electrode. The first power source and the first electrode may be electrically isolated from the system ground. The semiconductor processing chamber may further include a voltage monitor configured to provide a measurement indicative of a voltage induced on the substrate. The voltage induced on the substrate may vary based on a chucking state of the substrate.

In some embodiments, an electrostatic chuck may include a first electrode and a second electrode embedded in a pedestal configured to support a substrate during a semiconductor process. The electrostatic chuck may also include a first power source with a positive output that may be electrically connected to the first electrode. The electrostatic chuck may also include a negative output. The electrostatic chuck may additionally include a second power source with a negative output that may be electrically connected to the second electrode, and a positive output that may be electrically connected to the negative output of the first power source. The electrostatic chuck may further include a voltage monitor that may be electrically connected to the negative output of the first power source and the positive output of the second power source.

In some embodiments, a method of determining a chucking state of a substrate during a semiconductor process may include applying a first chucking voltage to a first electrode of an ESC in a pedestal configured to support the substrate. The first chucking voltage may be provided from a first output of a first power source for the ESC. The method may additionally include measuring a voltage at a second output of the first power source for the ESC. The method may also include determining the chucking state of the substrate based at least in part on the voltage at the second output of the first power source for the ESC.

In any embodiments, any and all of the following features may be implemented in any combination and without limitation. The semiconductor process may include a plasma-enhanced chemical vapor deposition (PECVD) process to deposit a film on the substrate. The semiconductor process may include depositing a carbon-based material on the substrate. The semiconductor processing chamber may include a top-feed RF power supply that provides RF power to a plasma in the processing region, where the RF power may be grounded through the first electrode and/or the second electrode. The semiconductor processing chamber may include a bottom-feed RF power supply that provides RF power to a plasma in the processing region, where the RF power may be provided through the first electrode and/or the second electrode. The semiconductor process may be performed at a temperature of between about 500° C. and about 700° C. The voltage monitor may be electrically connected to a first output of the first power source, and the first electrode may be electrically connected to a second output of the first power source. A connection between the positive output of the second power source and the negative output of the first power source may be floating relative to a system ground. A connection between the positive output of the second power source and the negative output of the first power source may have a voltage offset that equalizes current through the first electrode and the second electrode resulting from a bias induced on the substrate. The electrostatic chuck may form a continuous current path from the first power source, to the first electrode, to the substrate, to the second electrode, to the second power source, and back to the first power source. The continuous current path may not be connected to any free current paths to a system ground. The first electrode and the second electrode may form a bipolar electrostatic chuck. The first power source may provide a positive voltage to the first electrode, and the second power source may provide an equal and opposite negative voltage to the second electrode. A second chucking voltage may be applied to a second electrode of the ESC in the pedestal, where the second chucking voltage may be provided from a first output of a second power source for the ESC, and the second output of the first power source may be connected a second output of the second power source. The first power source and the first electrode may be floating relative to a system ground, and the voltage at the second output of the first power source may be measured relative to the system ground. Determining the chucking state of the substrate may include identifying a variation in the voltage at the second output of the first power source relative to a baseline voltage indicating that the substrate is fully chucked to the pedestal. Determining the chucking state of the substrate may include determining that the substrate is fully chucked flat against the pedestal. Determining the chucking state of the substrate may include determining that the substrate is bowed and a gap exists between the substrate and the pedestal.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

DETAILED DESCRIPTION

Electrostatic chucks (ESCs) are used to provide a clamping force between the substrate and the pedestal during semiconductor processes. However, it is difficult to measure a chucking state of the substrate during a live process, as this usually requires invasive measurements or additional hardware to be added to the pedestal. A new technique for monitoring a chucking state electrically isolates the ESC from the system ground to create a single conductive path through the ESC power supplies, ESC electrodes, and the substrate. A floating voltage between the two power supplies may change with the chucking state of the substrate, and this voltage may be monitored to determine the real-time chucking state of the substrate. This provides an unintrusive way to monitor the ESC state in real-time during a semiconductor process at the controller without disturbing the process or modifying the pedestal.

Although the remaining disclosure will routinely identify specific deposition processes utilizing the disclosed technology, it will be readily understood that the systems and methods are equally applicable to other deposition, etch, and cleaning chambers, as well as processes as may occur in the described chambers. Accordingly, the technology should not be considered to be so limited as for use with these specific deposition processes or chambers alone. The disclosure will discuss one possible chamber that may include components and may be operated according to embodiments of the present technology before additional variations and adjustments to this system according to embodiments of the present technology are described.

Figure 1:
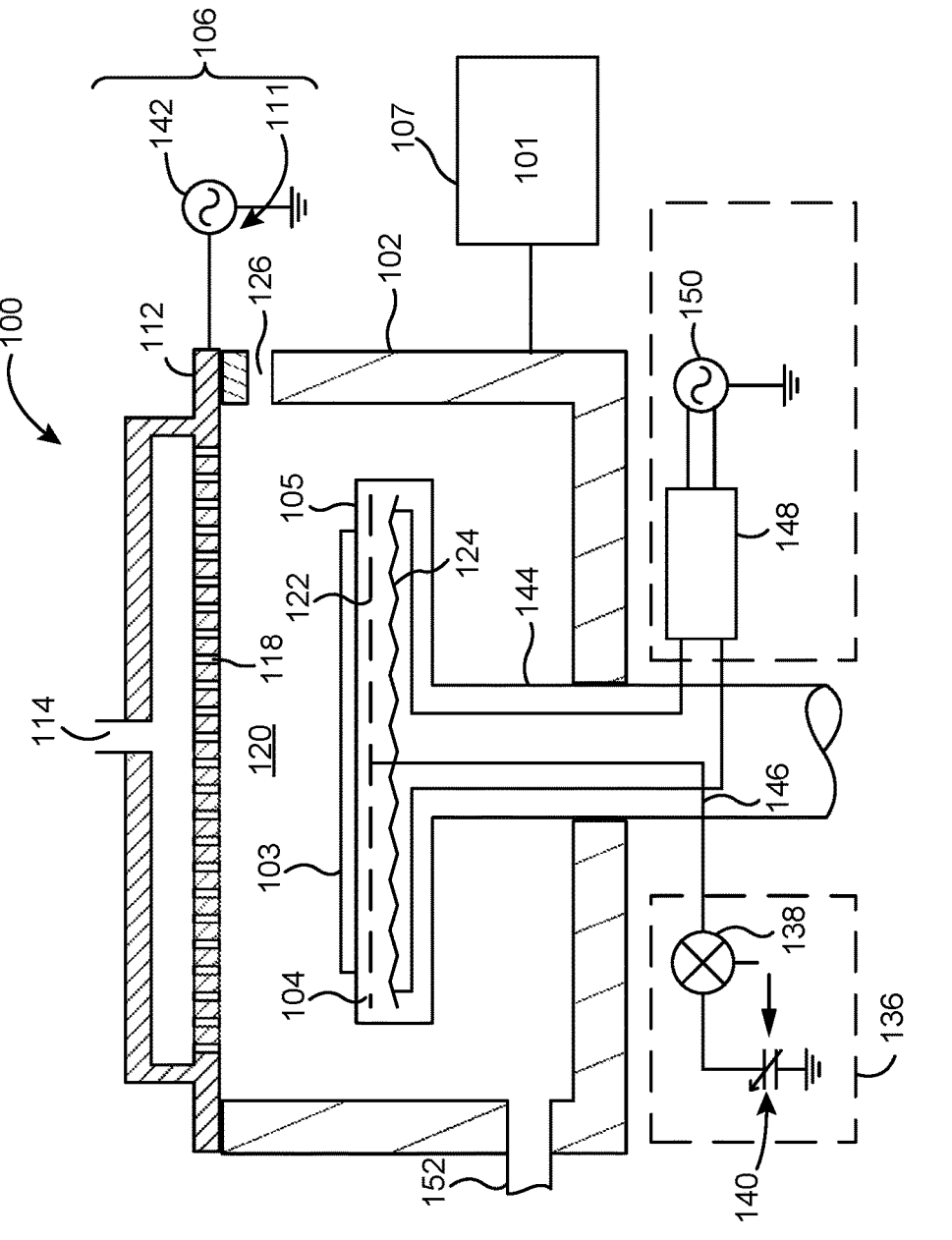
FIG. 1 illustrates a cross-sectional view of a processing chamber, according to some embodiments.

FIG. 1 shows a cross-sectional view of a processing chamber 100, according to some embodiments. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, along a vertical axis, where a shaft 144 of the substrate support 104 may be located, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a system controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the tuning circuit 136 in a closed loop. A set point for current or voltage, depending on the type of sensor used, may be installed in each sensor, and the sensor may be provided with control software that determines an adjustment to the electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Processing chamber 100 may be utilized in some embodiments of the present technology for processing methods that may include bottom-up deposition of materials for semiconductor structures. It is to be understood that the chamber described is not to be considered limiting, and any chamber that may be configured to perform operations as described may be similarly used.

Semiconductor processing chambers, such as the processing chamber 100 described above require tightly controlled environmental conditions in order to precisely deposit and/or etch complex and ever-shrinking circuit components. It is also important to limit the backside exposure of the substrate to the processing conditions that may result when there is a gap between the substrate and the pedestal. In order to ensure that the substrate does not move during the process, and to maintain a flat surface on the substrate that protects the backside of the substrate from exposure, electrostatic chucks are used to clamp the substrate to the pedestal. Electrostatic chucks apply a voltage to an electrode in the pedestal underneath the substrate. This voltage induces an opposing electric charge buildup on the substrate. These opposing electrostatic forces attract each other and provide a clamping force that securely holds the substrate on the pedestal during the semiconductor process.

One of the major challenges faced in systems using electrostatic chucks is accurately determining a chucking state of the substrate during a semiconductor process. When fully chucked, the substrate is prevented from moving on the pedestal during the process. The substrate is also held flat against the pedestal, which may correct for bowing or warpage that may have previously been induced in the substrate. If the substrate is not fully chucked against the pedestal, the horizontal profile of the substrate may vary from the center to the edge of the substrate, thereby causing inconsistent results of the semiconductor process (e.g., varying film thicknesses, varying etch depths, varying fill heights, and so forth). Additionally, a substrate that is not fully chucked against the pedestal may result in a gap between the substrate and the pedestal, thereby allowing the backside of the substrate to possibly be affected by the semiconductor process. An un-chucked substrate may also move on the pedestal, resulting in scratches or other damage to the backside of the substrate. Conversely, if the applied chucking voltage is too great, the force applied to the substrate may damage the substrate. For example, over-chucking the substrate may resulting cracks or shattering of the substrate.

However, accurately determining a chucking state of the substrate in situ during a semiconductor process represents a current technical challenge in semiconductor processing. Current techniques rely on mechanical or electrical sensors in the pedestal that detect the presence of the substrate. However, these techniques rely on additional modifications made to the traditional pedestal in order to add additional electrodes, capacitors, sensors, and so forth. Additionally, these additional components may interfere with the operation of the electrostatic chuck and/or the transmission of RF power to a plasma in the processing region.

The embodiments described herein solve these and other technical problems by using existing electrostatic chuck electrodes in the pedestal and adding a voltage sensor that is coupled to the power sources for the electrostatic chuck. Specifically, instead of electrically connecting the second outputs of the power sources for the ESC to the system ground, these outputs may be tied together and electrically isolated from the system ground. This may leave the ESC circuit, including the ESC power sources, ESC electrodes, and the substrate floating relative to the system ground. During processing, a voltage bias may be induced on the substrate. Since the floating ESC circuit forms a single current loop through the power sources, electrodes, and substrate, this induced voltage may cause a corresponding voltage to be present at the node between the two power sources. A voltage monitor may be connected to this node to monitor the voltage during the semiconductor process. Deviations of this voltage may be used to determine a real-time chucking state of the substrate.

Figure 2:
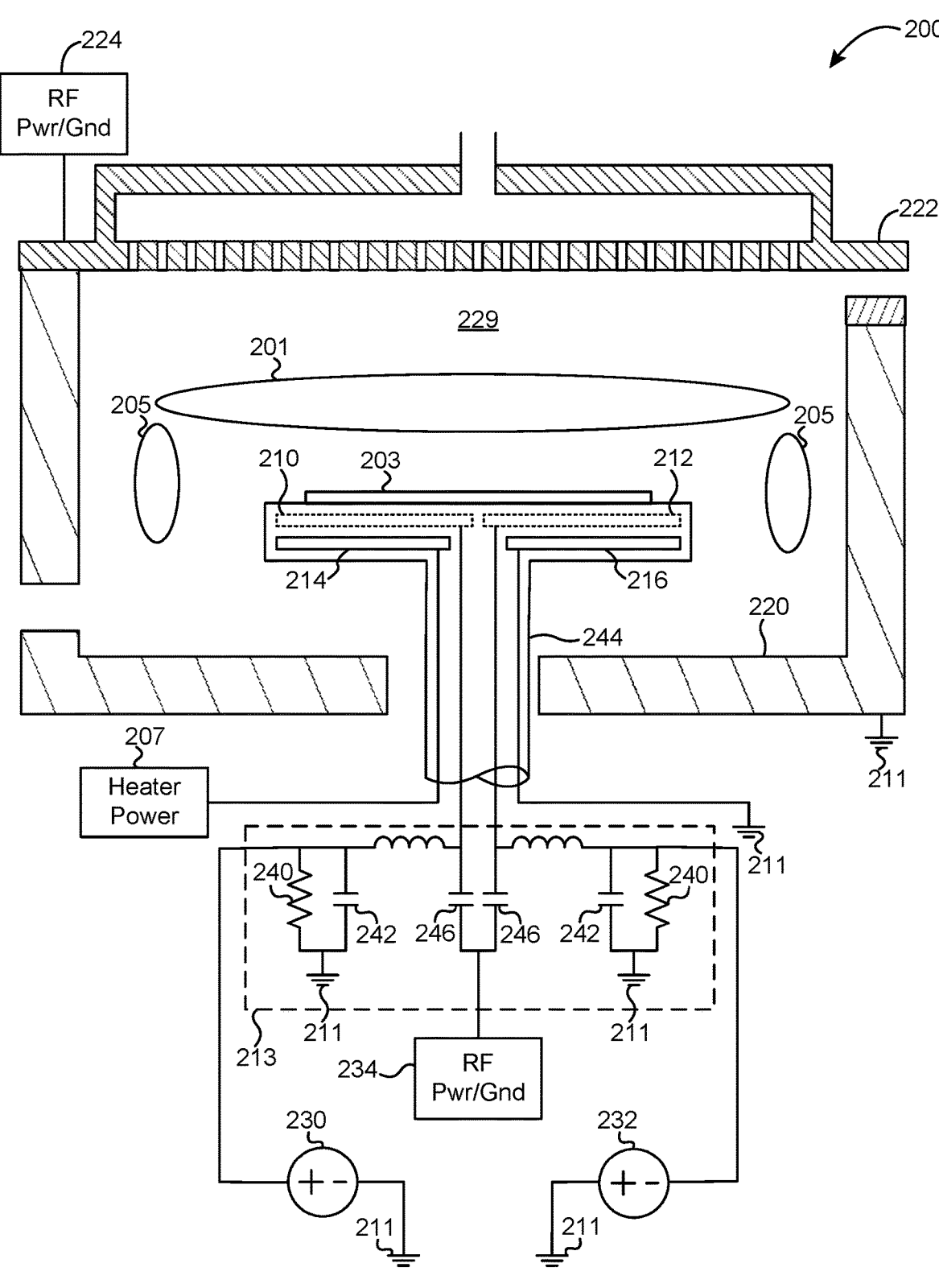
FIG. 2 illustrates an example of a processing chamber with grounded power supplies, according to some embodiments.

FIG. 2 illustrates an example of a processing chamber 200 with grounded power supplies, according to some embodiments. The processing chamber 200 may be used to perform any type of semiconductor process, such as deposition, etch, and so forth. The semiconductor processes may or may not include a plasma. For example, the processing chamber 200 may be configured to perform deposition processes, such as a plasma-enhanced chemical vapor deposition (PECVD). Any type of film or material may be deposited on the substrate 203. For example, some processes may be configured to deposit a carbon-based material on the substrate 203. Depositing a carbon-based material may be particularly susceptible to current arcs as described above.

Deposition operations in the processing chamber 200 may be performed at fairly high temperatures, such as temperatures between about 500° C. and about 1000° C. For example, semiconductor processes may be performed at temperatures between about 500° C. and about 600° C., between about 600° C. and about 700° C., between about 700° C. and about 800° C., between about 800° C. and about 900° C., between about 900° C. and about 1000° C., and so forth. Processes may also be performed at any interval encompassed by the intervals described above (e.g., between about 500° C. and about 700° C.). Processes may also be performed at any specific temperature encompassed by the intervals described above (e.g., about 650° C.).

The processing chamber may include a pedestal 244 that is configured to support a substrate 203 during a semiconductor process. The pedestal 244 may include one or more electrodes for an electrostatic chuck (ESC). In this example, a bipolar ESC may use a first electrode 210 and a second electrode 212. These electrodes may be formed using any conductive material, and may have many different geometries. For example, some embodiments may use electrodes constructed from a conductive wire mesh that are shaped as hemispheres, with each hemisphere occupying approximate half of the area beneath the substrate 203. Other electrode geometries may also be used without limitation, including concentric circles, interlaced geometries, and other geometries that are not hemispherical in nature. The pedestal 244 may also include one or more heating elements 214, 216, which may be located below the first electrode 210 and the second electrode 212 in the pedestal 244.

In some embodiments, the electrodes for the ESC may also be used to provide RF power to a plasma 201 that is formed in a processing region 229 of the processing chamber 200. For example, the first electrode 210 and the second electrode 212 may be electrically connected to an RF power supply 234. The RF power supply 234 may provide RF power to the first electrode 210 and/or the second electrode 212 to power the plasma 201. A top plate or showerhead 222 of the processing chamber 200 may be electrically connected to an RF ground 224. This may be referred to as a bottom-feed RF system. Alternatively, the first electrode 210 and the second electrode 212 may be electrically connected to the RF ground, while the showerhead 222 is electrically connected to the RF power supply. This may be referred to as a top-feed RF system. Some embodiments may also use a dual-feed system where a first RF power supply providing a first frequency at a first power level (e.g., a high-power, high-frequency source) may be electrically connected to the showerhead and grounded through the electrodes, while a second RF power supply providing a second frequency at a second power level (e.g., a low-power, low-frequency source) may be electrically connected to the electrodes and grounded through the showerhead. The embodiments described herein are compatible with each of these different RF systems. The RF power supply 234 may provide RF power at frequencies commonly used by semiconductor processes, such as 350 kHz, 13.56 MHz, 27 MHz, 60 MHz to about 100 MHz, 2.5 GHz, and/or other similar frequencies.

The processing chamber 200 may also include a chamber body 220 that encloses the pedestal 244 to form a processing region 229 in which the semiconductor process is performed. Generally, the chamber body may be electrically connected to a system ground 211. Generally, the system ground 211 will be the same as, or electrically connected to, the RF ground 224.

Leads for the different pedestal components, including the one or more heating elements 214, 216 and the ESC electrode, may be routed through a shaft of the pedestal 244. The one or more heating elements 214, 216 may be electrically connected to a heater power supply 207 and grounded to the system ground 211. When used to provide RF power, the ESC electrodes may also be connected to the RF power supply 234 (or alternatively to an RF ground) through decoupling capacitors 246 that filter DC voltages and protect the RF power supply 234. The first electrode 210 and the second electrode 212 may also be connected to a first power source 230 for the ESC and a second power source 232 for the ESC, respectively. A filter circuit 213 may filter out the RF signals while passing the DC signals to protect the power sources 230, 232 from the RF power for the plasma.

Chucking voltages may range from between about 500 VDC to about 2000 VDC, and some embodiments may use chucking voltages in excess of 1000 VDC. For example, the chucking voltage may range from between about 500 VDC to about 600 VDC, between about 600 VDC to about 700 VDC, between about 700 VDC to about 800 VDC, between about 800 VDC to about 900 VDC, between about 900 VDC to about 1000 VDC, between about 1000 VDC to about 1100 VDC, between about 1100 VDC to about 1200 VDC, between about 1200 VDC to about 1300 VDC, between about 1300 VDC to about 1400 VDC, between about 1400 VDC to about 1500 VDC, between about 1500 VDC to about 1600 VDC, between about 1600 VDC to about 1700 VDC, between about 1700 VDC to about 1800 VDC, between about 1800 VDC to about 1900 VDC, between about 1900 VDC to about 2000 VDC, and/or greater than about 2000 VDC. Chucking voltages may also be performed at any interval encompassed by the intervals described above (e.g., between about 1000 VDC and about 1500 VDC, greater than about 1000 VDC, etc.). Chucking voltages may also include any specific voltage encompassed by the intervals described above (e.g., about 1250 VDC). Note that these voltages described above may have both positive and negative magnitudes. For example, the first power source 230 may provide +1500 VDC to the first electrode 210, while the second power source 232 may provide −1500 VDC to the second electrode 212. Generally, these power sources may provide equal and opposite DC voltages to the pedestal 244 in an attempt to have equal current in both current pathways.

As illustrated in FIG. 2, the first power source 230 and the second power source 232 for the ESC are both electrically connected to the system ground 211. In this embodiment, the connection to the system ground 211 allows for multiple current pathways that may result in current arcs. For example, since the chamber body is also electrically connected to the system ground, a new current pathway from the first power source 230 through the first electrode 210 may be formed by a current arc between the first electrode 210 and a number of different pathways back to ground. For example, a current arc may discharge between the first electrode 210 and the one or more heating elements 214, 216. A current arc may discharge between the first electrode 210 and the plasma 201 above the substrate 203 and/or the plasma 205 to the side of the pedestal 244. Additionally, since an opposing charge may accumulate on the substrate 203, any of these current arcs may also discharge from the substrate to, e.g., the plasma 201, the chamber body 220, or any other component coupled to the system ground 211. As described above, these current arcs may cause damage the substrate 203 and/or the processing chamber 200. Since the separate current pathways through the first power source 230 and the second power source 232 are connected to the system ground 211, current arcs are more readily formed as the charge finds other pathways back to the system ground 211. In other words, separate DC current loops are possible to other portions of the processing chamber 200 back to the system ground 211.

Additionally, even when equal and opposite voltages are used by the first power source 230 and the second power source 232, the current may not be equal in the two current pathways through the first electrode 210 and the second electrode 212. For example, after a steady-state chucking voltage has been applied to the electrodes, asymmetry and imbalances in the physical design of the processing chamber 200, the substrate 203, and/or the placement of the substrate 203 on the pedestal 244 may cause imbalances in the current of the two leads to the electrodes for the ESC. Additionally, plasma conditions in the processing region may also induce a DC self-bias onto the substrate. The DC self-bias may cause an imbalance between the electrode chucking force and the current for each electrode. When the current is not balanced, the resulting chucking force may be imbalanced, and any current difference may be supplied through the system ground 211 as a current arc.

Figure 3:
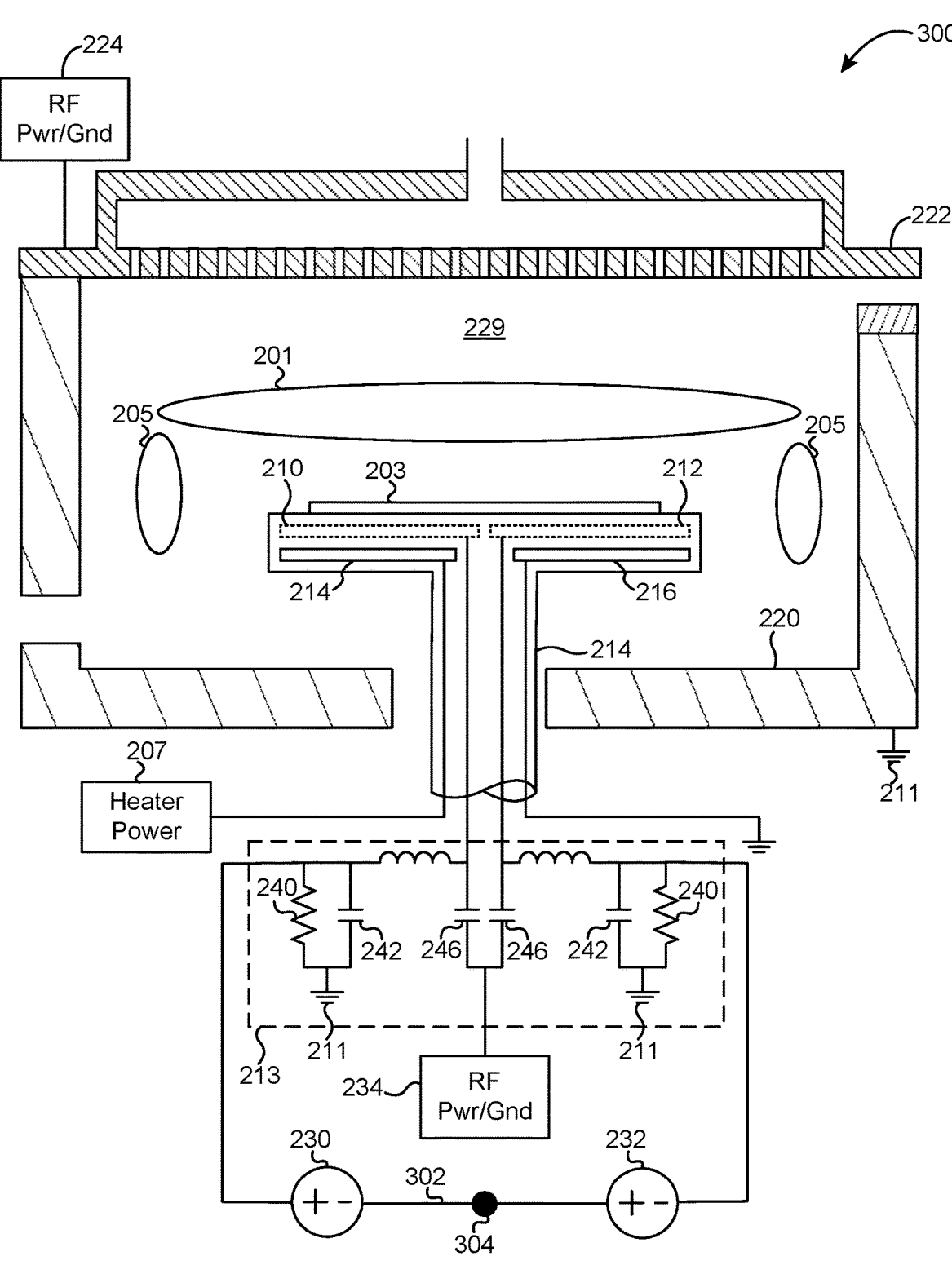
FIG. 3 illustrates a processing chamber with floating power supplies, according to some embodiments.

FIG. 3 illustrates a processing chamber 300 with floating power supplies, according to some embodiments. Instead of electrically connecting the first power source 230 and second power source 232 to the system ground 211, this system instead allows these power supplies and the ESC circuit as a whole to float relative to the system ground 211. For example, FIG. 3 illustrates how the first power source 230 may have a positive output and a negative output, with the positive output electrically connected to the first electrode 210. Similarly, the second power source 232 may also have a positive output a negative output, with the negative output electrically connected to the second electrode 212. In order to float these power sources relative to the system ground, a connection may be made between the positive output of the second power source 232 and the negative output of the first power source 230. These power supplies may be electrically isolated from the system ground 211.

As used herein, the term "electrically connected" implies a conductive connection without significant resistance (e.g., less than about 1 kΩ of resistance). The term "electrically isolated" implies a non-conductive connection with significant resistance (e.g., greater than about 1 MΩ of resistance).

By connecting the power supplies in this manner and removing the connection to the system ground 211, the electrostatic chuck forms a continuous current path from the first power source 230, to the first electrode 210, to the substrate 203, to the second electrode 212, to the second power source 232, and back to the first power source 230. Because of this single current path, the current in each ESC leads to/from the pedestal 244 will have a balanced, equal current. By eliminating the free connections to the system ground 211, it becomes far less likely that excess charge will exit this single, continuous current path through a damaging current arc.

When the first power source 230 provides a positive voltage to the first electrode 210, and the second power source 232 provides an equal and opposite negative voltage to the second electrode 212, the current through each of the ESC leads in the pedestal 244 will be equalized. However, the connection 302 between the positive output of the second power source 232 and the negative output of the first power source 230 may have a voltage offset that equalizes the current to the first electrode 210 and the second electrode 212. Specifically, a node 304 may have a non-zero voltage bias that adjusts dynamically during the semiconductor process to equalize the currents to the electrodes. For example, if the plasma induces a negative bias on the wafer, this may cause a corresponding voltage on the node 304 to compensate for the induced bias on the wafer. Additionally, by tying the first power source 230 and second power source 232 together, this allows these power sources to provide different voltage values, since any current imbalance that would otherwise result will be balanced by the shifting the voltage of the node 304.

As described above, some embodiments may share the first electrode 210 and/or the second electrode 212 between the electrostatic chuck and the RF system for powering the plasma 201. In order to maintain the isolation of the DC electrostatic chuck current pathway, the filter circuit 213 may be configured to provide DC isolation between the system ground 211 and the components of the electrostatic chuck. For example, a resistance 240 between the power supplies for the ESC and the ESC electrodes may be configured to have a resistance value sufficient to electrically isolate the DC voltage of the ESC from the system ground 211. For example, for ESC voltages up to about 2000 V, the resistance value can be determined by calculating the typical current of a current arc (e.g., about 5 mA) and using a resistance value large enough such any current through the resistor will be less than the current arc. For example, resistances greater than 1 MΩ may be sufficient in some designs to electrically isolate the system ground from the ESC in the filter circuit 213.

Similarly, capacitances 242 may also be designed with a capacitance value sufficient to isolate the system ground 211 from the ESC. For example, some embodiments may use capacitances with values between about 15 nF and about 25 nF for a bottom-feed RF system. For top-feed RF systems, the capacitances 242 and/or 246 may be tunable capacitors that may be adjusted based on the RF frequency of the plasma power source, along with other considerations.

The processing chamber 300 may be characterized as being substantially free of current arcs in the pedestal 244, in the processing region 229, and elsewhere resulting from the electrostatic chuck. For example, chucking voltages of up to +2000 V and −2000V may be used on the electrostatic chuck and generated by the ESC power sources without resulting in current arcs in the processing region 229. These voltages may be used in high temperatures, such as temperatures up to or in excess of about 1000° C. during PECVD deposition of carbon-based materials and/or other types of films.

Since the conditions in each processing chamber and the characteristics of each substrate may vary greatly across any semiconductor process, properly chucking the substrate to the pedestal may need to be verified for each individual process, and even for individual stage within a process. For example, the position of the substrate, the flatness of the substrate, the temperature of the process, the pressure of the chamber, the power and gas species applied to the plasma, and/or other characteristics may affect the chucking state of the substrate. Therefore, a uniform chucking voltage is not always guaranteed to optimally chuck the substrate across numerous processes, processing stages, substrate types, and processing chambers. Complicating matters further, adequately assessing the chucking state of the substrate during the semiconductor process is very difficult without affecting the process itself. Therefore, a determination as to whether the substrate was properly chucked is often made after the process is complete based on the results. Existing in situ measurement techniques cannot be universally used with all processes and substrates. For example, backside helium flow may be used in very low pressure processes, but this technique is not practical at the pressures required for most plasma-enhanced chemical vapor deposition (PECVD) processes. Other techniques require additional sensors or hardware to be installed in the pedestal.

Figure 4:
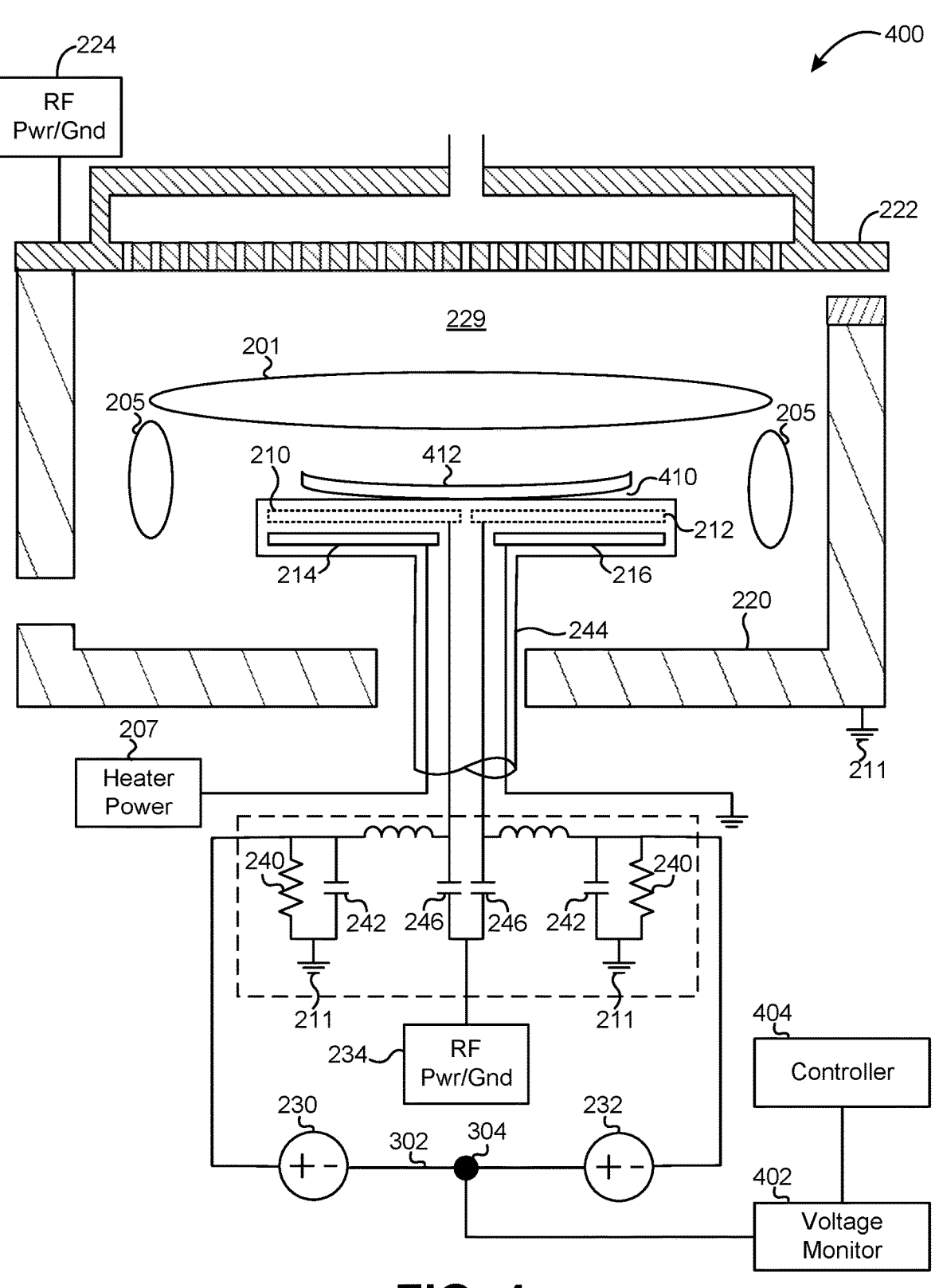
FIG. 4 illustrates a system that includes a voltage monitor that may be used to determine a real-time chucking state of a substrate during a process, according to some embodiments.

The embodiments described herein solve these and other technical problems to determine a chucking state of the substrate in situ during a semiconductor process as it is being performed. FIG. 4 illustrates a system 400 that includes a voltage monitor 402 that may be used to determine a real-time chucking state of a substrate during a process, according to some embodiments. The system 400 may be similar to the system 300 described above in FIG. 3. For example, the system may include a pedestal 244 configured to support a substrate 412 during semiconductor process, such as a PECVD process. The pedestal 244 may include a first electrode 210 the first electrode 210 may be electrically connected to a first power source 230 for the ESC. As described above, the first power source 230 and the first electrode 210 may be electrically isolated from the system ground 211. When used as a bipolar electrostatic chuck, the system 400 may also include a second electrode 212 that is electrically connected to a second power source 232, both of which may also be electrically isolated from the system ground 211.

The system 400 may also include a voltage monitor 402. For example, the voltage monitor 402 may be implemented using a large resistance between the node 304 and the system ground 211. The large resistance may be greater than 1 MΩ, greater than 10 MΩ, greater than 50 MΩ, greater or than 100 MΩ. The size of the large resistance may be selected in order to maintain electrical isolation from the system ground 211. The voltage monitor 402 may monitor a voltage drop across the large resistance or may monitor a current through the resistance. Other embodiments may monitor the voltage between the node 304 and the system ground by monitoring a voltage drop across other electrical components (capacitances, transistors, etc.) without imitation. Thus, the voltage monitor 402 may monitor the voltage at the node 304 relative to the system ground 211 while still maintaining the electrical isolation between the node 304 and the system ground 211.

The voltage monitor 402 may be controlled by a controller 404. The controller 404 may be the same or similar to the system controller 101 described above in FIG. 1. For example, the controller 404 may include one or more processors and one or more memory devices storing instructions for the processors. The memory devices may include one or more non-transitory computer-readable media that store computer instructions. The controller 404 may be implemented with a local controller for the system 400. Alternatively or additionally, the controller 404 may be distributed between a local controller and a remote server. The server may be configured to control multiple processing chambers on a tool or platform. The server may also be configured to control multiple processing chambers within one or more facilities. In some embodiments, the server may be cloud-based. The server may also collect data from the system 400 during semiconductor processes.

As described above, the plasma or other processing conditions may cause a voltage to be present on the substrate 412. Since the ESC floats relative to the system ground 211 and forms a single conductive path, a corresponding voltage at the node 304 may also be formed in response to the voltage present on the substrate 412, which may be at the middle point of electrodes 210 and 212. The voltage monitor 402 may thus monitor the voltage of the substrate 412 by monitoring the voltage at the node 304.

It has been discovered that the voltage on the substrate 412 may be affected by a chucking state of the substrate 412. When the substrate 412 is fully chucked and flat against the pedestal 244, a first voltage present on the substrate 412 may indicate that the substrate 412 is fully chucked or that a gap does not exist between the substrate 412 and the pedestal 244. Variations in this voltage may indicate that the substrate 412 is not fully chucked against the pedestal 244 and/or that a gap 410 exists between the substrate 412 and the pedestal 244. Therefore, the voltage at node 304 and/or the voltage induced on the substrate 412 may be indicative of a chucking state of the substrate 412.

Figure 5:
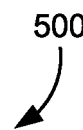
FIG. 5 illustrates a flowchart of a method for determining a chucking state of a substrate during a semiconductor process, according to some embodiments.
Figure 5:
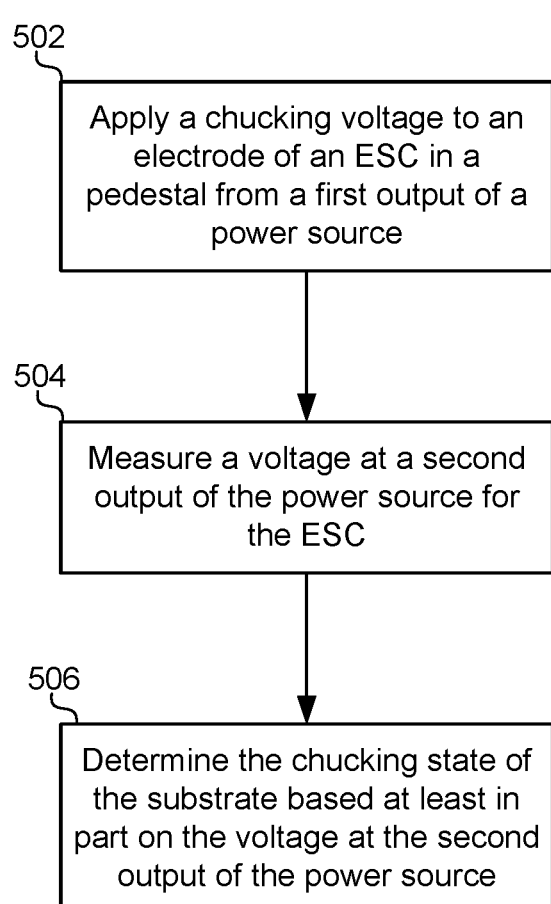

FIG. 5 illustrates a flowchart of a method 500 for determining a chucking state of a substrate during a semiconductor process, according to some embodiments. This method may be carried out by the system as a whole, including the voltage monitor 402, the controller 404, and/or any other component described above. In some embodiments, this method may be carried out by the controller 404 as outputs of the controller 404 cause components of the system 400 to behave as described. For example, this method may be embodied in instructions stored on a non-transitory computer-readable medium that is read by processors of the controller 404.

The method 500 may include applying a first chucking voltage to a first electrode of an electrostatic chuck in a pedestal configured to support a substrate (502). The first chucking voltage may be provided from a first output of a first power source for the ESC. For example, a DC voltage source may include at least two outputs: a positive output and a negative output. As used herein, the "first output" of a power source may be designated as the output is electrically connected to the corresponding ESC electrode in the pedestal. Thus, the first power source 230 in FIG. 4 may designate the positive output as the "first output," as the positive output is connected to the first electrode 210. The negative output of the first power source may also be designated as the "second output."

As described above, a bipolar ESC may also include a second power source that is electrically connected to a second electrode in the pedestal. In the example of FIG. 4, the second power source 232 may designate the negative output as the "first output," as the negative output is connected to the second electrode 212. The positive output of the second power source 232 may be designated as the "second output." Note that the second output of the first power source 230 and the second output of the second power source 232 may be electrically connected to each other, the node 304, and/or the voltage monitor 402.

The method 500 may also include measuring a voltage at a second output of the first power source for the ESC (504). As illustrated in FIG. 4, the second output (e.g., the negative output) of the first power source 230 may also be electrically connected to the node 304 and/or the second output (e.g., the positive output) of the second power source 232. This measurement may be made by the voltage monitor 402 and read by the controller 404. This measurement may be made before, during, and/or after the semiconductor process is performed on the substrate 412. This measurement made by the voltage monitor 402 may be made relative to the system ground 211 while still maintaining electrical isolation of the ESC power sources and electrodes. The voltage monitor 402 may provide the measurement to the controller 404 in real-time. For example, the voltage monitor 402 may continuously sample the voltage at the node 304 and provide the measurements to the controller 404 as a time series of voltage measurements.

The method 500 may additionally include determining a chucking state of the substrate based at least in part on the measured voltage (506). The controller 404 may process a single measurement and/or a plurality of measurements received as a time series of measurements throughout the semiconductor process. If the substrate is not fully chucked, a gap may exist between the substrate and the pedestal. The gap may greatly affect the impedance between the substrate and the ESC electrode, as well as the impendence between the plasma and the ESC electrode. This may result in a measurable change in the voltage at node 304. This change in voltage may be monitored in real time, and a voltage shift may be observed over time as the process progresses.

The voltage measurements may be used to identify the chucking state of the substrate 412 from known chucking states. For example, a first chucking state may indicate that the substrate 412 is chucked substantially flat against the pedestal 244. A sufficient chucking voltage may be applied to prevent the substrate 412 from moving on the pedestal 244. A second chucking state may indicate that the substrate 412 is not substantially chucked flat against the pedestal 244. This may indicate that one or more gaps 410 are present between the substrate 412 and the pedestal 244. These gaps may exist at the periphery of the substrate 412 when the substrate 412 bows upward at the edges of the substrate 412. Airgaps may also exist in other locations, such as at a center of the substrate 412. In some embodiments, the voltage measurements may deviate from a reference voltage or previous voltage, and the magnitude of this deviation may indicate how well the substrate 412 is chucked to the pedestal 244. For example, the more the measured voltage deviates from a previous or reference voltage, the greater the gap(s) 410 may become. Thus, some embodiments may determine a degree of how well a substrate is chucked rather than simply indicating whether the substrate is chucked or not.

Some embodiments may also characterize a shape of the substrate based on the voltage. For example, a large deviation in the measured voltage may indicate that the substrate 412 is substantially chucked to a larger degree than normal. This larger voltage deviation may be used to characterize the shape of the substrate 412 as having a severe bow. This shape may be characterized as a "potato chip" bow. A more mild voltage deviation may be used to characterize the shape of the substrate 412 as merely being warped, where opposing edges of the substrate 412 curl up or down. A minor voltage deviation may characterize the shape of the substrate 412 as including more local bends, warps, and/or other more minor deviations. For example, the controller 404 may provide an output indicating that a chucking state of the substrate is "X % chucked" and characterizing the shape of the substrate 412 as having a "severe/mild/minor bow."

As described above, the chucking state of the substrate may also be affected by changing process parameters during a semiconductor process. For example, during a PECVD process the temperature, pressure, gas species, plasma power, and/or other process parameters and environmental conditions may change according to a process recipe. The controller 404 may control these parameters and cause them to be adjusted differently for each step in the recipe. It has been discovered that these process conditions may affect the voltage induced on the substrate and/or the chucking state of the substrate. Therefore, the embodiments described herein may continuously monitor the voltage measured by the voltage monitor 402 throughout the semiconductor process, since the chucking state may change with changing environmental conditions.

Figure 6:
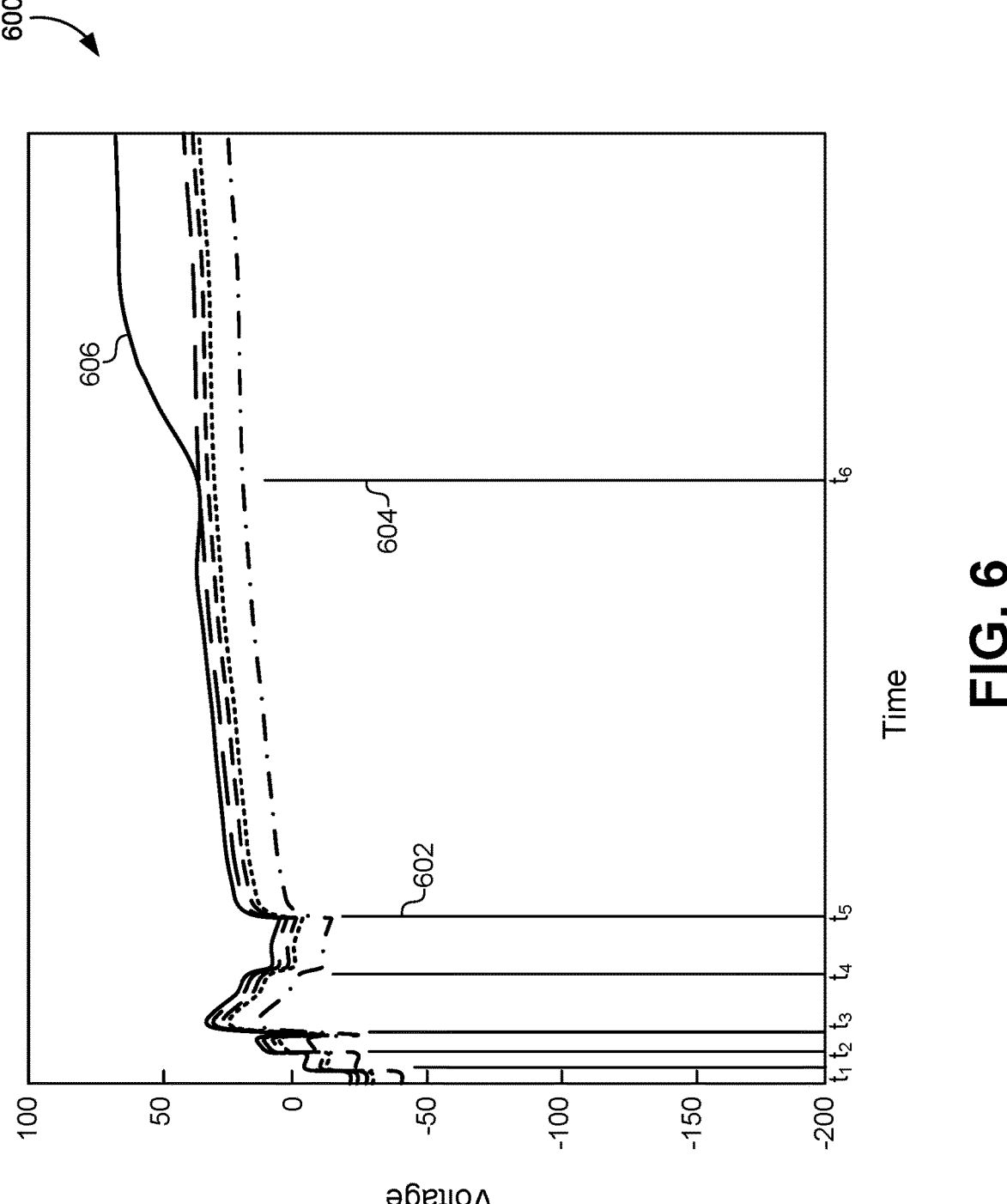
FIG. 6 illustrates a graph of a time series of voltage measurements during a semiconductor process, according to some embodiments.

FIG. 6 illustrates a graph 600 of a time series of voltage measurements during a semiconductor process, according to some embodiments. Each of the different curves illustrated in the graph 600 may correspond to a semiconductor process using a common recipe that is carried out on different substrates. Each of the timestamps on the time axis of the graph 600 may represent transitions between different process parameters according to the process recipe. Note that the voltage measured by the voltage monitor may change without necessarily indicating that the chucking state of the substrate has changed. For example, when transitioning between different recipe stages at $t_4$ and $t_5$, the voltage of each individual curve changes. However, since the voltages of the different curves tend to change in a similar fashion, this change in voltage may be attributed to the change in recipe parameters rather than a change in the chucking state.

In this example, the general shape of four of the voltage curves are very similar. However, the voltage curve 606 begins to deviate significantly at $t_6$. This may represent a change in the chucking state of the substrate represented by voltage curve 606. Note that the changes in the chucking state need not result explicitly from changes in the recipe state. Instead, as material is deposited and/or removed from the substrate, this may add/remove stress on the substrate and cause the chucking state to change. Therefore, time $t_6$ may represent a time in the middle of a recipe step where the substrate develops a bow that changes the chucking state. The time $t_6$ may alternatively represent a change in the recipe that causes a change in the chucking state. Generally, an increase in the voltage may represent a substrate becoming less chucked to the pedestal.

The controller may process the time series of voltage measurements in different ways to identify when a voltage deviation indicates a change in the chucking state. As illustrated in the graph 600, changes in the recipe or parameters may contribute to changes in voltage that do not necessarily indicate a change in the chucking state. Therefore, some embodiments may use voltage measurements from previous processes using this recipe and performed on previous substrates to derive a baseline set of measurements for comparison. For example, previous processes may be identified where the chucking state of the substrate did not change from a fully chucked state during the process. The voltage measurements from these previous processes may be averaged or otherwise combined to form a baseline shape of an expected voltage curve during the process. The shape of this baseline voltage curve may then be used to normalize subsequent real-time sets of voltage measurements from subsequent process. The controller may then use the normalized measurements to identify a voltage deviation indicating a change in the chucking state. In other words, the normalization process may remove the changes in the voltage measurements that are due to the recipe or other parameter changes, and any remaining voltage deviations may be more likely to be attributed to a change in the chucking state. These voltage deviations may be compared to a threshold, and changes above that threshold may indicate a change in the chucking state.

Some embodiments may alternatively monitor the voltage measurements and determine a chucking state without using previous voltage measurements from previous processes. For example, the voltage deviations that may be attributed to changes in the process parameters or recipe changes may be expected to be less than a threshold voltage change. Deviations greater than this threshold may be identified to indicate a change in the chucking state. For example, changes of 30 V may be within the expected range of voltage deviations attributed to process parameter changes. A voltage change of 50 V may be compared to this threshold and used to determine that the chucking state of the substrate has changed.

Each of the methods described herein may be implemented by a computer system or controller. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 7:
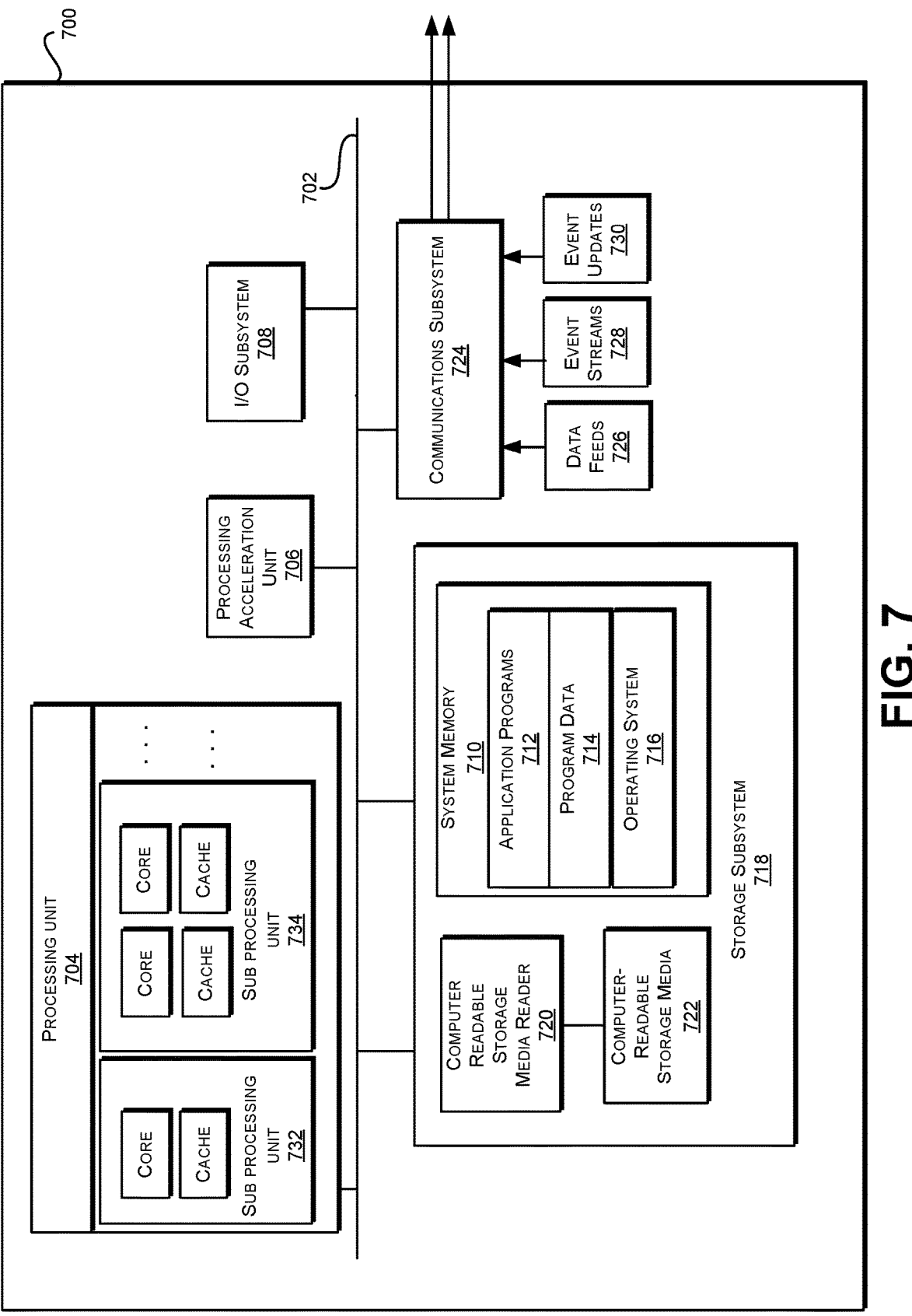
FIG. 7 illustrates an exemplary computer system or controller in which various embodiments may be implemented.

FIG. 7 illustrates an exemplary computer system 700, in which various embodiments may be implemented. The system 700 may be used to implement any of the computer systems described above. As shown in the figure, computer system 700 includes a processing unit 704 that communicates with a number of peripheral subsystems via a bus subsystem 702. These peripheral subsystems may include a processing acceleration unit 706, an I/O subsystem 708, a storage subsystem 718 and a communications subsystem 724. Storage subsystem 718 includes tangible computer-readable storage media 722 and a system memory 710.

Bus subsystem 702 provides a mechanism for letting the various components and subsystems of computer system 700 communicate with each other as intended. Although bus subsystem 702 is shown schematically as a single bus, alternative embodiments of the bus subsystem may utilize multiple buses. Bus subsystem 702 may be any of several types of bus structures including a memory bus or memory controller, a peripheral bus, and a local bus using any of a variety of bus architectures. For example, such architectures may include an Industry Standard Architecture (ISA) bus, EtherCAT, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 704, which can be implemented as one or more integrated circuits (e.g., a conventional microprocessor or microcontroller), controls the operation of computer system 700. One or more processors may be included in processing unit 704. These processors may include single core or multicore processors. In certain embodiments, processing unit 704 may be implemented as one or more independent processing units 732 and/or 734 with single or multicore processors included in each processing unit. In other embodiments, processing unit 704 may also be implemented as a quad-core processing unit formed by integrating two dual-core processors into a single chip.

In various embodiments, processing unit 704 can execute a variety of programs in response to program code and can maintain multiple concurrently executing programs or processes. At any given time, some or all of the program code to be executed can be resident in processor(s) 704 and/or in storage subsystem 718. Through suitable programming, processor(s) 704 can provide various functionalities described above. Computer system 700 may additionally include a processing acceleration unit 706, which can include a digital signal processor (DSP), a special-purpose processor, and/or the like.

I/O subsystem 708 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may also include, without limitation, three dimensional (3D) mice, joysticks or pointing sticks, graphic tablets, and audio/visual devices such as speakers, digital cameras, webcams, image scanners, fingerprint scanners, barcode reader 3D scanners, 3D printers, laser rangefinders, and so forth.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 700 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 700 may comprise a storage subsystem 718 that comprises software elements, shown as being currently located within a system memory 710. System memory 710 may store program instructions that are loadable and executable on processing unit 704, as well as data generated during the execution of these programs.

Depending on the configuration and type of computer system 700, system memory 710 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 704. In some implementations, system memory 710 may include multiple different types of memory, such as static random access memory (SRAM) or dynamic random access memory (DRAM). In some implementations, a basic input/output system (BIOS), containing the basic routines that help to transfer information between elements within computer system 700, such as during start-up, may typically be stored in the ROM. By way of example, and not limitation, system memory 710 also illustrates application programs 712, which may include client applications, Web browsers, mid-tier applications, relational database management systems (RDBMS), etc., program data 714, and an operating system 716.

Storage subsystem 718 may also provide a tangible computer-readable storage medium for storing the basic programming and data constructs that provide the functionality of some embodiments. Software (programs, code modules, instructions) that when executed by a processor provide the functionality described above may be stored in storage subsystem 718. These software modules or instructions may be executed by processing unit 704. Storage subsystem 718 may also provide a repository for storing data used in accordance with some embodiments.

Storage subsystem 700 may also include a computer-readable storage media reader 720 that can further be connected to computer-readable storage media 722. Together and, optionally, in combination with system memory 710, computer-readable storage media 722 may comprehensively represent remote, local, fixed, and/or removable storage devices plus storage media for temporarily and/or more permanently containing, storing, transmitting, and retrieving computer-readable information.

Computer-readable storage media 722 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 700.

By way of example, computer-readable storage media 722 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 722 may include, but is not limited to, Zip® drives, flash memory cards, universal serial bus (USB) flash drives, secure digital (SD) cards, DVD disks, digital video tape, and the like. Computer-readable storage media 722 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 700.

Communications subsystem 724 provides an interface to other computer systems and networks. Communications subsystem 724 serves as an interface for receiving data from and transmitting data to other systems from computer system 700. For example, communications subsystem 724 may enable computer system 700 to connect to one or more devices via the Internet. In some embodiments communications subsystem 724 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 724 can provide wired network connectivity (e.g., Ethernet) in addition to or instead of a wireless interface.

In some embodiments, communications subsystem 724 may also receive input communication in the form of structured and/or unstructured data feeds 726, event streams 728, event updates 730, and the like on behalf of one or more users who may use computer system 700.

By way of example, communications subsystem 724 may be configured to receive data feeds 726 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 724 may also be configured to receive data in the form of continuous data streams, which may include event streams 728 of real-time events and/or event updates 730, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 724 may also be configured to output the structured and/or unstructured data feeds 726, event streams 728, event updates 730, and the like to one or more databases that may be in communication with one or more streaming data source computers coupled to computer system 700.

Computer system 700 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 700 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification. For example, these terms may represent values within 10% of a stated value.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides example embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A semiconductor processing chamber comprising:
   a pedestal configured to support a substrate during a semiconductor process, wherein the pedestal comprises a first electrode and a second electrode for an electrostatic chuck (ESC);
   a chamber body that encloses the pedestal to form a processing region in which the semiconductor process is performed, wherein the chamber body is electrically connected to a system ground;
   a first power source for the ESC that is electrically connected to the first electrode, wherein the first power source and the first electrode are electrically isolated from the system ground; and a voltage monitor configured to provide a measurement indicative of a voltage induced on the substrate, wherein the voltage monitor is electrically connected to a first output of the first power source, and the first electrode is electrically connected to a second output of the first power source, and the voltage induced on the substrate varies based on a chucking state of the substrate.

2. The semiconductor processing chamber of claim 1, wherein the semiconductor process comprises a plasma-enhanced chemical vapor deposition (PECVD) process to deposit a film on the substrate.

3. The semiconductor processing chamber of claim 1, wherein the semiconductor process comprises depositing a carbon-based material on the substrate.

4. The semiconductor processing chamber of claim 1, further comprising a top-feed RF power supply that provides RF power to a plasma in the processing region, wherein the RF power is grounded through the first electrode and/or the second electrode.

5. The semiconductor processing chamber of claim 1, further comprising a bottom-feed RF power supply that provides RF power to a plasma in the processing region, wherein the RF power is provided through the first electrode and/or the second electrode.

6. The semiconductor processing chamber of claim 1, wherein the semiconductor process is performed at a temperature of between about 500° C. and about 700° C.

7. An electrostatic chuck comprising:

a first electrode and a second electrode embedded in a pedestal configured to support a substrate during a semiconductor process, wherein the first electrode and the second electrode form a bipolar electrostatic chuck;

a first power source comprising a positive output that is electrically connected to the first electrode, and a negative output;

a second power source comprising a negative output that is electrically connected to the second electrode, and a positive output that is electrically connected to the negative output of the first power source; and a voltage monitor that is electrically connected to the negative output of the first power source and the positive output of the second power source.

8. The electrostatic chuck of claim 7, wherein a connection between the positive output of the second power source and the negative output of the first power source is floating relative to a system ground.

9. The electrostatic chuck of claim 7, wherein a connection between the positive output of the second power source and the negative output of the first power source comprises a voltage offset that equalizes current through the first electrode and the second electrode resulting from a bias induced on the substrate.

10. The electrostatic chuck of claim 7, wherein the electrostatic chuck forms a continuous current path from the first power source, to the first electrode, to the second electrode, to the substrate, to the second power source, and back to the first power source.

11. The electrostatic chuck of claim 10, wherein the continuous current path is not connected to any free current paths to a system ground.

12. The electrostatic chuck of claim 7, wherein the first power source provides a positive voltage to the first electrode, and the second power source provides an equal and opposite negative voltage to the second electrode.

13. A method of determining a chucking state of a substrate during a semiconductor process, the method comprising:

applying a first chucking voltage to a first electrode of an electrostatic chuck (ESC) in a pedestal configured to support the substrate, wherein the first chucking voltage is provided from a first output of a first power source for the ESC;

measuring a voltage at a second output of the first power source for the ESC; and determining the chucking state of the substrate based at least in part on the voltage at the second output of the first power source for the ESC, wherein determining the chucking state of the substrate comprises determining whether the substrate is fully chucked flat against the pedestal, or whether the substrate is bowed or a gap exists between the substrate and the pedestal.

14. The method of claim 13, further comprising:

applying a second chucking voltage to a second electrode of the ESC in the pedestal, wherein the second chucking voltage is provided from a first output of a second power source for the ESC, and the second output of the first power source is connected a second output of the second power source.

15. The method of claim 13, wherein the first power source and the first electrode are floating relative to a system ground, and the voltage at the second output of the first power source is measured relative to the system ground.

16. The method of claim 13, wherein determining the chucking state of the substrate comprises identifying a variation in the voltage at the second output of the first power source relative to a baseline voltage indicating that the substrate is fully chucked to the pedestal.

* * * * *